(12) United States Patent
Yoshida

(10) Patent No.: US 6,396,085 B1
(45) Date of Patent: May 28, 2002

(54) GAN-TYPE SEMICONDUCTOR VERTICAL FIELD EFFECT TRANSISTOR

(75) Inventor: Seikoh Yoshida, Tokyo (JP)

(73) Assignee: The Furukawa Electric Co., LTD, Tokyo (JP)

( * ) Notice: Subject to any disclaimer, the term of this patent is extended or adjusted under 35 U.S.C. 154(b) by 0 days.

(21) Appl. No.: 09/841,819

(22) Filed: Apr. 25, 2001

(30) Foreign Application Priority Data

Apr. 25, 2000 (JP) .......................................... 2000-124134

(51) Int. Cl.$^7$ .......................... H01L 29/74; H01L 31/111
(52) U.S. Cl. .......................... 257/135; 257/192; 438/285
(58) Field of Search .................................. 257/135, 132, 257/133, 192, 494, 489, 289, 194, 24, 94, 356, 168, 365

(56) References Cited

U.S. PATENT DOCUMENTS 5,319,221 A  *  6/1994  Ueno ......................... 257/135

* cited by examiner

Primary Examiner—David Nelms
Assistant Examiner—Andy Huynh
(74) Attorney, Agent, or Firm—Knobbe, Martens, Olson & Bear, LLP

(57) ABSTRACT

A vertical field effect transistor having an MES-type structure high in withstand voltage and capable of high current operation is realized through effective use of GaN-type semiconductors. Specifically, a source electrode and a drain electrode are formed on the top and the bottom of a GaN-type semiconductor multilayer film, respectively, to realize the vertical-structured field effect transistor. The field effect transistor has a device structure in which an n$^-$-GaN layer (first semiconductor layer) of low carrier concentration, constituting the source-to-drain current path, is provided with an n$^+$-GaN layer (fourth semiconductor layer) via an undoped i-GaN layer (second semiconductor layer), a p$^+$-GaN layer, and a p$^-$-GaN layer (third semiconductor layer). Then, an n$^+$-GaN layer (fifth semiconductor layer) for constituting a channel layer is formed thinly in the top of the n$^-$-GaN layer beneath a gate electrode.

7 Claims, 3 Drawing Sheets

GAN-TYPE SEMICONDUCTOR VERTICAL FIELD EFFECT TRANSISTOR

BACKGROUND OF THE INVENTION

1. Field of the Invention

The present invention relates to a vertical-structured field effect transistor made of GaN-type semiconductors. In particular, the invention relates to a vertical-structured field effect transistor including a source electrode arranged on the top of a GaN-type semiconductor multilayer film and a drain electrode arranged on the bottom of the semiconductor multilayer film, the field effect transistor having a high withstand voltage and being capable of high current operation.

2. Description of the Prior Art

Recently, field effect transistors having a compound semiconductor MES (metal-semiconductor) structure, or MES-FETs, have been developed actively. An MES-FET having a GaN-type compound semiconductor of this kind is typically formed on a semi-insulating sapphire substrate by MOCVD (Metal Organic Chemical Vapor Deposition). Specifically, the MES-FET has a device structure in which an undoped GaN buffer layer is formed on the sapphire substrate, an undoped GaN layer is formed on this GaN buffer layer, and an Si-doped GaN layer is grown as an active layer upon this GaN layer. Then, an $SiO_2$ film is deposited on the surface of the GaN layer (active layer) by plasma CVD or other methods before the $SiO_2$ film is patterned with a photo resist by chemical etching or other methods so that electrode portions are exposed. Subsequently, such metal as Al/Ti/Au is evaporated on the exposed portions to form a source electrode and a drain electrode, respectively. Moreover, Pt/Au is evaporated on as a gate electrode to realize the MES-FET.

Nevertheless, when GaN-type compound semiconductors are used to materialize, for example, an MES-FET that has a high withstand voltage of 500 V or more and is capable of operation under high currents of 10 A or more, there would occur several problems. Specifically, a device structure of planar type in which the source, drain, and gate electrodes are formed on the top surface of the semiconductor device requires an epitaxial wafer of greater area, which means a limit in device size. Besides, thickening a channel to lower the resistance of the channel necessitates increasing the carrier concentration of the channel by using such techniques as double diffusion which is employed in the process of fabricating large scale integrated circuits. This causes troubles including much greater fabrication difficulties. In other words, there remain various kinds of problems in fabricating an MES-FET capable of high current operation from wide-gap compound semiconductors such as GaN and AlGaN.

SUMMARY OF THE INVENTION

An object of the present invention is to make effective use of wide-gap, GaN-type compound semiconductors which theoretically have smaller ON-state resistances under operation, thereby realizing a vertical field effect transistor with an MES type structure having a higher withstand voltage and being capable of high current operation.

To achieve the foregoing object, the present invention provides a field effect transistor having a vertical structure including a source electrode formed on the top of a semiconductor multilayer film of GaN type and a drain electrode formed on the bottom of the semiconductor multilayer film, comprising the following first through fifth semiconductor layers.

The first semiconductor layer is composed of a GaN-type semiconductor having a low impurity concentration, and constitutes a current path between the source electrode and drain electrode. This first semiconductor layer is also provided with a groove portion.

The second semiconductor layer is a high-resistance semiconductor layer composed of an undoped GaN-type semiconductor, and is arranged in the groove portion.

The third semiconductor layer is composed of a GaN-type semiconductor having conductivity reverse to that of the first semiconductor layer, and is arranged in the groove portion via the second semiconductor layer.

The fourth semiconductor layer is composed of a GaN-type semiconductor having conductivity identical to that of the first semiconductor layer, and is buried in the third semiconductor layer to constitute a source region.

A source electrode is arranged on the top surface of the source region in the fourth semiconductor layer. A gate electrode is arranged so as to be insulated from the source electrode.

Then, the fifth semiconductor layer is composed of a GaN-type semiconductor having conductivity identical to that of the first semiconductor layer, and is formed to extend from the top of the first semiconductor layer beneath the gate electrode to the fourth semiconductor layer to constitute a channel layer.

That is, the vertical field effect transistor according to the present invention is realized as a vertical-structured MES-FET so that an electric current is passed from the source region (fourth semiconductor layer) through the thin channel layer (fifth semiconductor layer) beneath the gate electrode to flow through the current-path-constituting semiconductor layer of low impurity concentration (first semiconductor layer) to the drain electrode on the backside. In particular, the current-path-constituting first semiconductor layer of low impurity concentration is formed with a greater thickness to increase the source-to-drain distance. In addition, the fifth semiconductor layer which constitutes the channel layer is thinned to reduce the pinch-off voltage. Another feature lies in that the second semiconductor layer of high resistance, made of the undoped GaN-type semiconductor, suppresses current leaks through the first and fifth semiconductor layers, thereby enhancing the withstand voltage.

The drain electrode is preferably formed either on the backside of a conductive substrate on which the first semiconductor layer is formed or on the backside of the first semiconductor being rid of the conductive substrate, depending on the thermal conductivity of the conductive substrate. Specifically, when the conductive substrate is made of SiC which has thermal conductivity better than that of GaN, the drain electrode is formed on the backside of the conductive substrate. On the contrary, if sapphire or other material with poor thermal conductivity is used for the conductive substrate, the conductive substrate is eliminated and the drain electrode is formed on the backside of the first semiconductor layer.

The first to fifth semiconductor layers constituting the vertical field effect transistor according to the present invention are preferably formed by gas source MBE (Molecular Beam Epitaxy) or MOCVD (Metal Organic Chemical Vapor Deposition).

More specifically, the vertical field effect transistor according to the present invention is materialized, for example, by making the first semiconductor layer in the form of a lightly-Si-doped $n^-$-GaN layer, the second semiconductor layer an undoped i-GaN layer, the third semiconductor layer a p⁺-GaN layer, the fourth semiconductor layer an n⁺-GaN layer, and the fifth semiconductor layer an n⁺-GaN layer in succession.

According to the present invention, it is possible to provide a vertical field effect transistor that has a device structure in which the semiconductor layer constituting the source region is surrounded by the reverse-conductive semiconductor layer as well as the undoped high-resistance semiconductor layer, and the thin channel layer is formed in the top of a semiconductor layer of low carrier concentration which constitutes the current path.

In addition, according to the present invention, GaN-type semiconductors can be used to provide a field effect transistor having a vertical MES structure, with suppressed leakage currents and the capability of high current operation. Besides, the properties of the GaN-type semiconductors can be fully used to provide a vertical-structured field effect transistor which has a lower ON-state resistance under operation, a high withstand voltage, and excellent temperature characteristics.

Moreover, when the first semiconductor layer has favorable crystallinity, the vertical field effect transistor according to the present invention may be materialized with a device structure in which either one of the second and third semiconductor layers is omitted.

DETAILED DESCRIPTION OF THE INVENTION

Hereinafter, a vertical field effect transistor having an MES structure of GaN-type semiconductors according to an embodiment of the present invention will be described with reference to the drawings.

Figure 1:
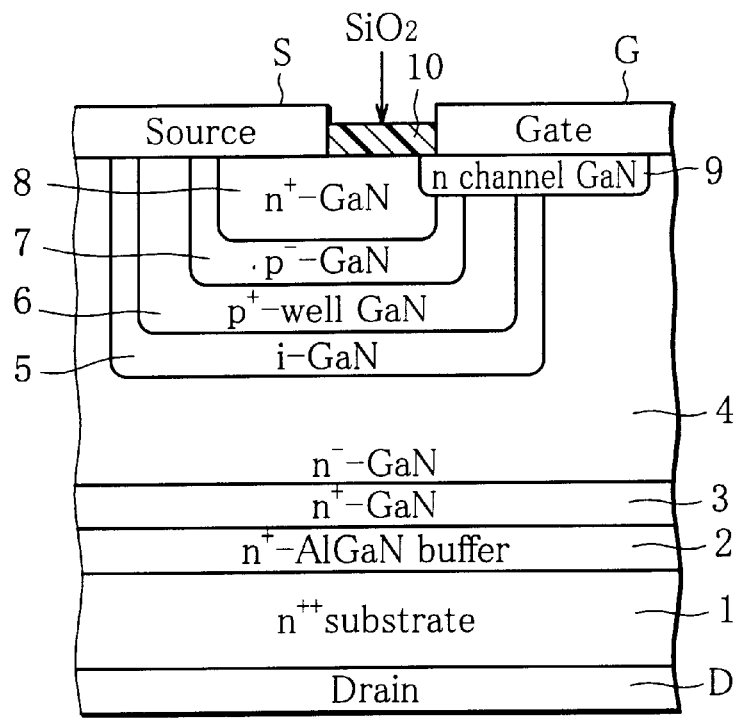
FIG. 1 is a diagram showing a schematic device structure of a vertical field effect transistor having an MES structure of GaN-type semiconductors according to an embodiment of the present invention.

FIG. 1 shows a schematic device structure of the MES-FET having a high withstand voltage and being capable of high current operation according to this embodiment. This MES-FET basically includes a source electrode S and a gate electrode G arranged on the top of its GaN-type semiconductor multilayer film, along with a drain electrode D arranged on the bottom of the semiconductor multilayer film.

The semiconductor multilayer film in this MES-FET is formed through successive crystal growth of GaN-type semiconductor layers by, for example, gas source molecular beam epitaxy (MBE). However, the GaN-type semiconductor layers may also be crystal-grown by metal organic chemical vapor deposition (MOCVD).

In this embodiment, the GaN film growth (formation) is performed in an MBE system which includes an ultrahigh vacuum system having a deposition chamber and a patterning chamber. The GaN film formation uses such organometallic gases as triethyl gallium and trimethyl gallium for the Ga source, and dimethylhydrazine for the nitrogen source. Incidentally, the nitrogen source may be monomethylhydrazine, ammonia, or the like. Besides, mono-silane is used as the n-type dopant, and dicyclopentadienyl Mg or other organic Mg is used as the p-type dopant.

Hereinafter, the device structure of the above-described MES-FET will be described in accordance with the fabrication steps thereof.

Initially, an n⁺⁺-Si substrate 1, heavily doped with the n-type impurities, is prepared as a conductive substrate in the deposition chamber. Then, a 50-nm-thick conductive n⁺-AlGaN buffer layer (n; $5 \times 10^{18}$ cm$^{-3}$) 2 is formed on this Si substrate 1 by the molecular beam epitaxy at a growth temperature of 640° C. This n$^{30}$ -AlGaN buffer layer 2 is formed with radicalized nitrogen ($4 \times 10^{-4}$ Pa≈$3 \times 10^{-6}$ Torr) and Ga ($6.6 \times 10^{-5}$ Pa≈$5 \times 10^{-7}$ Torr) as the sources, along with Si ($6.6 \times 10^{-7}$ Pa≈$5 \times 10^{-9}$ Torr) and Al ($1.3 \times 10^{-5}$ Pa≈$1 \times 10^{-7}$ Torr).

Next, an n⁺-GaN layer (n; $5 \times 10^{18}$ cm$^{-3}$) 3, or a semiconductor layer to constitute a drain region, is formed on the AlGaN buffer layer 2 by the molecular beam epitaxy at a growth temperature of 850° C. This n⁺-GaN layer 3 is grown with Ga ($6.6 \times 10^{-5}$ Pa≈$5 \times 10^{-7}$ Torr) and ammonia ($6.6 \times 10^{-3}$ Pa≈$5 \times 10^{-5}$ Torr) as the sources, and with Si ($6.6 \times 10^{-7}$ Pa≈$5 \times 10^{-9}$ Torr) as the dopant.

Then, on this n⁺-GaN layer 3, a lightly-Si-doped n⁻-GaN layer (n; $1-3 \times 10^{17}$ cm$^{-3}$) 4 is grown to a thickness of 4000 nm as a first semiconductor layer of low impurity concentration which constitutes the source-to-drain current path. This n⁻-GaN layer 4 is grown with Ga ($1.3 \times 10^{-4}$ Pa≈$1 \times 10^{-6}$ Torr) and ammonia ($6.6 \times 10^{-3}$ Pa≈$5 \times 10^{-5}$ Torr) as the sources, with Si ($6.6 \times 10^{-7}$ Pa≈$5 \times 10^{-9}$ Torr) as the dopant, and by the molecular beam epitaxy at a growth temperature of 850° C.

Figure 2:
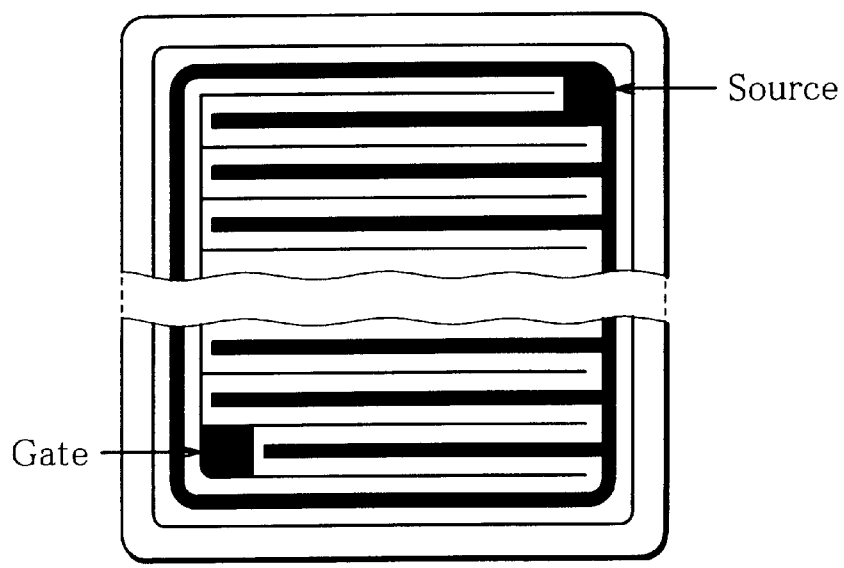
FIG. 2 is a diagram showing a pattern structure of the source electrode and gate electrode formed on the top surface of the semiconductor multilayer film in the vertical field effect transistor shown in FIG. 1.

Thereafter, a part of the n⁻-GaN layer 4 to be used as the after-mentioned region between the source and drain is selectively etched away by dry etching to form a U-shaped groove. This groove has a depth on the order of, e.g., 1000 nm. Besides, this groove is formed in the top of the GaN-type semiconductor multilayer film so that it lies between a source electrode S and a gate electrode G in accordance with the respective electrode shapes of the source electrode S and the gate electrode G which are formed, for example, in a comb-like involuted arrangement as shown in FIG. 2.

Next, a third semiconductor layer is formed within the above-described groove via a second semiconductor layer. These second and third semiconductor layers have the functions of isolating the source-to-drain current path to be formed in the groove as described later from the surrounding n⁻-GaN layer 4 to avoid current leaks, and enhancing the withstand voltage therebetween. Specifically, an undoped i-GaN layer 5 is initially grown as a second semiconductor layer of high resistance. Then, as a reverse-conductive third semiconductor layer, a p⁺-GaN layer (p; $25 \times 10^{18}$ cm$^{-3}$) 6 is grown on this i-GaN layer 5 by the molecular beam epitaxy. This p⁺-GaN layer 6 is formed with Ga ($6.6 \times 10^{-5}$ Pa≈$5 \times 10^{-7}$ Torr) and ammonia ($6.6 \times 10^{-3}$ Pa≈$5 \times 10^{-5}$ Torr) as the sources, and with Mg ($1.3 \times 10^{-6}$ Pa≈$1 \times 10^{-8}$ Torr) as the dopant. The p⁺-GaN layer 6 formed thus has the functions of making the after-mentioned channel layer thinner and avoiding current leaks through a source region.

Next, a p⁻-GaN layer (p; $5\times10^{17}$ cm$^{-3}$) 7 is grown on the p⁺-GaN layer 6 by the molecular beam epitaxy. This p⁻-GaN layer 7 is grown with Ga ($6.6\times10^{-5}$ Pa≈$5\times10^{-7}$ Torr) and ammonia ($6.6\times10^{-3}$ Pa≈$5\times10^{-5}$ Torr) as the sources, and with Mg ($1.3\times10^{-7}$ Pa≈$1\times10^{-9}$ Torr) as the dopant.

Thereafter, an n⁺-GaN layer (n; $5\times10^{18}$ cm$^{-3}$) 8, serving as a fourth semiconductor layer to be a source region, is grown in this p⁻-GaN layer 7 so as to fill in the above-mentioned groove completely. This n⁺-GaN layer 8 is grown with Ga ($6.6\times10^{-5}$ Pa≈$5\times10^{-7}$ Torr) and ammonia ($6.6\times10^{-3}$ Pa≈$5\times10^{-5}$ Torr) as the sources, with Si ($6.6\times10^{-7}$ Pa≈$5\times10^{-9}$ Torr) as the dopant, and by the molecular beam epitaxy.

Thereafter, a groove for making a channel layer is formed to extend from the top of the GaN layer 4 beneath the gate electrode G to the n⁺-GaN layer 8, with a depth of the order of e.g. 250 nm by selective etching. Note that the gate electrode G is spaced away from the source electrode S arranged on the top surface of the n⁺-GaN layer 8, as shown in FIG. 2, so that it is insulated from the source electrode S. In this groove, an n⁺-GaN layer (n; $1–2\times10^{17}$ cm$^{-3}$) 9 is grown as a fifth semiconductor layer for making a channel layer, by the molecular beam epitaxy. This n⁺-GaN layer 9 is formed with Ga ($6.6\times10^{-5}$ Pa≈$5\times10^{-7}$ Torr) and ammonia ($6.6\times10^{-3}$ Pa≈$5\times10^{-5}$ Torr) as the sources, and with Si ($1.1\times10^{-5}$ Pa≈$8\times10^{-8}$ Torr) as the dopant.

In the manner described above, the n⁺-GaN layer 8 to form the source region is buried in the n⁻-GaN layer 4 via the undoped i-GaN layer 5 and the p⁻-GaN layer 7 in order. Moreover, the n⁺-GaN layer 9 to be the channel layer is thinly formed beneath the gate electrode G, thereby fabricating a GaN-type semiconductor multilayer film (epitaxial layer) in the device structure that constitutes the vertical field effect transistor.

Next, SiO₂ is formed as a protective film over the entire surface (top surface) by a thermochemical deposition method. Then, the SiO₂ film deposited on the surface of the epitaxial layer is selectively etched by photolithography and dry etching, so as to expose part of the n⁺-GaN layer 9 to be the channel layer and a portion of the n⁺-GaN layer 8 to be the source region which adjoin the n⁺-GaN layer 9. Subsequently, an SiO₂ film 10 to be an insulative gate film is deposited on the exposed portions with a thickness of e.g. 1 μm.

Thereafter, a mask is formed thereover, and patterning for electrode formation is applied to this mask. Here, the gate portion is patterned in a comb-like shape as shown in FIG. 2 so that it has, for example, a gate length of 0.5 μm and a gate width of 2 μm in total. Then, the patterned mask is used to evaporate metal composed of Pt/Au on the gate portion to a thickness of 1–1.5 μm, thereby forming a gate electrode G.

Subsequently, another mask is formed and patterned. The patterned mask is used to form the source electrode S as shown in FIG. 2. This source electrode S is formed, for example, by evaporating Al/Ti/Au and lifting off the same to a thickness of 1–1.5 μm. Then, a drain electrode D composed of Al/Ti/Au is formed with a thickness of 1–1.5 μm over the entire backside of the conductive n⁺⁺-Si substrate 1 described before. This realizes the vertical MES-structured field effect transistor. Incidentally, these electrodes S, D, and G may be formed as ohmic electrodes of Ta-Si/Au, W-Si/Au, or the like.

In the MES-FET fabricated thus and provided with such a device structure as described above, the n⁺-GaN layer 8 constituting the source region is surrounded by the reverse-conductive p⁺-GaN layer 6 and p⁻-GaN layer 7. Moreover, the n⁺-GaN layer 8 constituting the source region is covered with the high-resistance i-GaN layer 5 when buried in the n⁻-GaN layer 4 which constitutes the source-to-drain current path. This allows sure prevention of current leaks through the pn junction between the n⁻-GaN layer 4 and the p⁺-GaN layer 6, and sufficient improvement of the withstand voltage therebetween.

Besides, the n⁻-GaN layer 4 constituting the source-to-drain current path has a lower carrier concentration as well as a sufficient thickness. In addition, the n⁺-GaN layer 9 constituting the channel layer has a smaller thickness for the sake of lower pinch-off voltage. Therefore, a high current can be passed vertically from the top surface (source region) to the bottom surface (drain region) through the n⁻-GaN layer 4. Moreover, the n⁻-GaN layer 4 for allowing the vertical high current flow can be realized while keeping the device size small. Thus, a semiconductor device (field effect transistor) with an MES structure having a high withstand voltage and being capable of high current operation can be realized easily while maximizing the advantage of the GaN-type semiconductors in that they have smaller ON-state resistances under operation.

Incidentally, when MES-FET prototypes fabricated as described above were examined for operating characteristics, it was confirmed that the source-drain voltage became saturated at 10 A and the withstand voltage exceeded 500 V. It was also confirmed that the ON-state resistance was as sufficiently low as 10 mΩ·cm² and stable operation was made even under a high temperature of 300° C.

Figure 3:
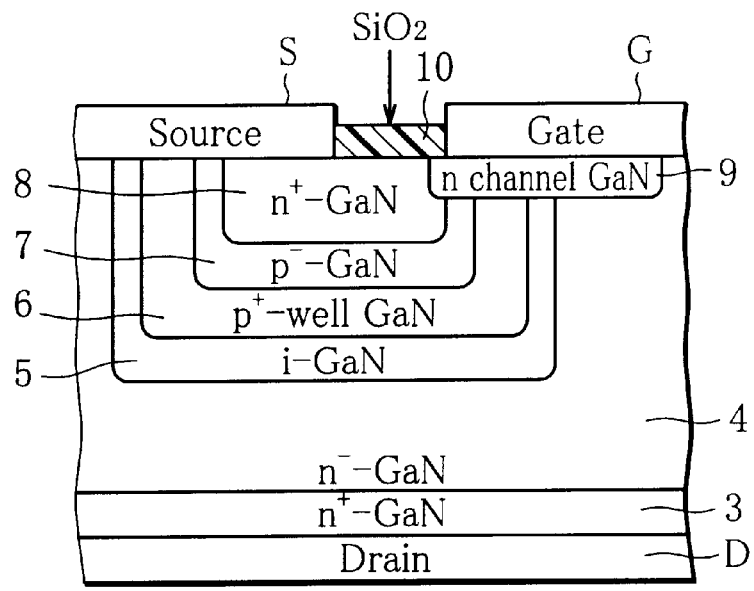
FIG. 3 is a diagram showing a schematic device structure of a vertical field effect transistor according to a second embodiment of the present invention.

It should be noted that the present invention is not limited to the embodiment described above. For example, the conductive Si substrate 1 and the n⁺-AlGaN buffer layer 2 may be eliminated as shown in FIG. 3, so that the drain electrode D is formed directly on the backside of the drain-region-constituting n⁺-GaN layer 3 exposed thereby. This elimination of the conductive substrate 1 is suitable for such cases that the substrate 1 is poor in thermal conductivity as compared with GaN such as sapphire.

On the contrary, when the conductive substrate 1 uses SiC or other material with better thermal conductivity than GaN, that substrate 1 is preferably left in terms of thermal design. In this regard, the Si substrate 1 is generally equal to GaN in thermal conductivity. Thus, whether to leave or to eliminate the Si substrate 1 may be determined in consideration of the electric characteristics of the device.

Figure 4:
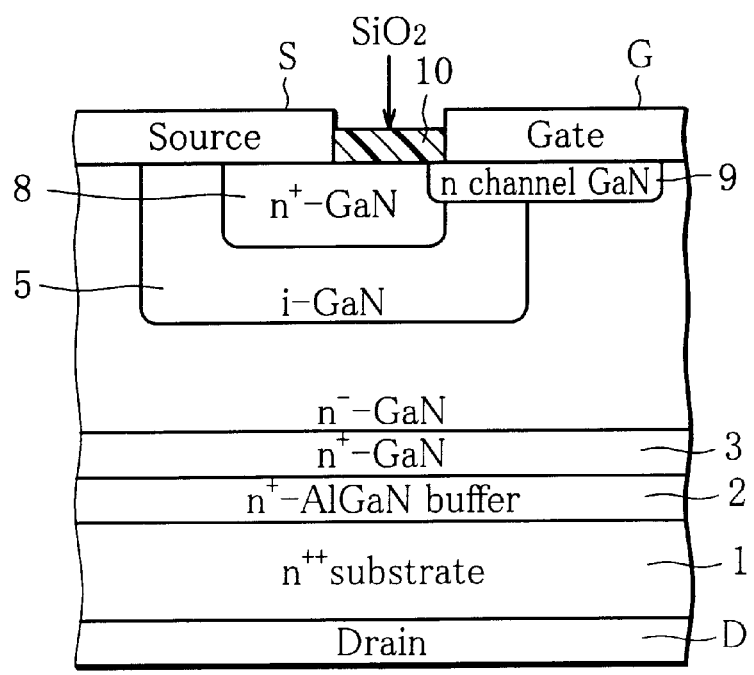
FIG. 4 is a diagram showing a schematic device structure of a vertical field effect transistor according to a third embodiment of the present invention.

Now, in the cases where the lightly-Si-doped n⁻-GaN layer 4, or the first semiconductor layer, has favorable crystallinity, the undoped i-GaN layer 5 serving as the second semiconductor layer may be formed in the groove formed in the n⁻-GaN layer 4 before the n⁺-GaN layer 8 which serves as the fourth semiconductor layer to be a source region on this i-GaN layer 5 is buried directly into the i-GaN layer 5 as shown in FIG. 4. In other words, the formation of the p⁺-GaN layer 6 and p⁻-GaN layer 7, or the third semiconductor layer, may be omitted.

Even in the device structure in which the third semiconductor layer (the p⁺-GaN layer 6, the p⁻-GaN layer 7) is omitted thus, the n⁺-GaN layer 8 for constituting the source region is covered with the high-resistance i-GaN layer 5 when buried into the n⁻-GaN layer 4 which constitutes the source-to-drain current path. Accordingly, the high-resistance i-GaN layer 5 can surely prevent leakage of the current that flows between the source and drain, as well as sufficiently enhance the withstand voltage therebetween.

Figure 5:
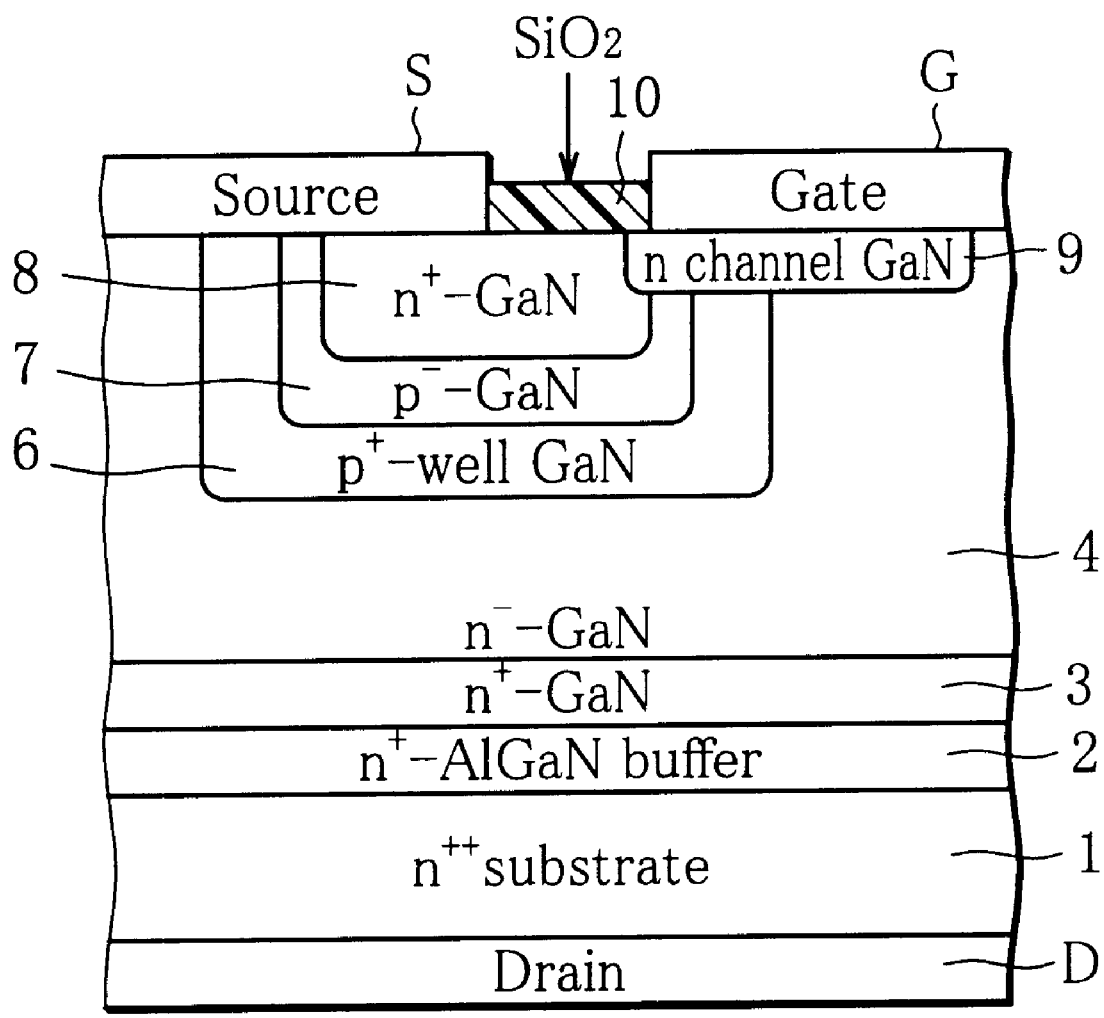
FIG. 5 is a diagram showing a schematic device structure of a vertical field effect transistor according to a fourth embodiment of the present invention.

Alternatively, as shown in FIG. 5, the undoped i-GaN layer 5 serving as the second semiconductor layer may be omitted so that the p$^+$-GaN layer 6 and p$^-$-GaN layer 7 which serve as the reverse-conductive third semiconductor layer are successively formed in the groove formed in the n$^-$-GaN layer 4. Even in the device structure in which the second semiconductor layer (i-GaN layer 5) is omitted thus, the n$^+$-GaN layer 8 to be the source region is covered with the p$^+$-GaN layer 6 and p$^-$-GaN 7, or the third semiconductor layer. Accordingly, the pn junction between the n$^-$-GaN layer 4 and the p$^+$-GaN layer 6 can surely prevent leakage of the current that flows between the source and drain, as well as sufficiently improve the withstand voltage therebetween.

In the embodiments described above, GaN is used for the n layers. The n layers, however, may use Si- or otherwise-doped $In_{1-x}Ga_xN$ ($0 \leq x \leq 1$), $In_xGa_yAl_{1-x-y}N$ ($0 \leq x, y \leq 1$), $Al_xGa_{1-x}N$ ($0 \leq x \leq 1$), $In_xGa_{1-x}N_{1-y}As_y$ ($0 \leq x, y \leq 1$), $In_xGa_{1-x}N_yP_{1-y}$ ($0 \leq x, y \leq 1$), and so on. The p layers may use Mg-doped $In_{1-x}Ga_xN$ ($0 \leq x \leq 1$), $In_xGa_yAl_{1-x-y}N$ ($0 \leq x, y \leq 1$), $Al_xGa_{1-x}N$ ($0 \leq x \leq 1$), $In_xGa_{1-x}N_yAs_{1-y}$ ($0 \leq x, y \leq 1$), $In_xGa_{1-x}N_yP_{1-y}$ ($0 \leq x, y \leq 1$), and so on.

Furthermore, the i layer may use $Al_{1-x}Ga_xN$ ($0 \leq x \leq 1$), $In_{1-x}Ga_xN$ ($0 \leq x \leq 1$), $In_{1-x}Ga_xN_yAs_{1-y}$ ($0 \leq x, y \leq 1$), $In_xGa_{1-x}N_yP_{1-y}$ ($0 \leq x, y \leq 1$), and so on. The conductive substrate 1 may use Sic, Si, GaAs, GaP, or the like as appropriate. A rectangular groove may be arranged in the gate portion so that the gate area is increased for the sake of yet higher currents. Moreover, various modifications may be made to the present invention in practice without departing the gist thereof.

What is claimed is:

1. A field effect transistor having a vertical structure including a source electrode formed on the top of a semiconductor multilayer film of GaN type and a drain electrode formed on the bottom of said semiconductor multilayer film, said semiconductor multilayer film of GaN type including first through fifth semiconductor layers, wherein:
   said first semiconductor layer is composed of a GaN-type semiconductor having a low impurity concentration, and constitutes a current path between said source electrode and drain electrode, said first semiconductor layer being provided with a groove portion;
   said second semiconductor is a high-resistance semiconductor layer composed of an undoped GaN-type semiconductor, and is arranged in said groove portion;
   said third semiconductor layer is composed a GaN-type semiconductor having conductivity reverse to that of said first semiconductor layer, and is arranged in said groove portion via said second semiconductor layer;
   said fourth semiconductor layer is composed of a GaN-type semiconductor having conductivity identical to that of said first semiconductor layer, and is buried in said third semiconductor layer to constitute a source region;
   a source electrode is arranged on the top surface of said source region in said fourth semiconductor layer, and a gate electrode is arranged so as to be insulated from said source electrode; and
   said fifth semiconductor layer is composed of a GaN-type semiconductor having conductivity identical to that of said first semiconductor layer, and is formed to extend from the top of said first semiconductor layer beneath said gate electrode to said fourth semiconductor layer to constitute a channel layer.

2. The field effect transistor having a vertical structure of GaN-type semiconductors according to claim 1, wherein
   if a conductive substrate on which said first semiconductor layer is formed has a thermal conductivity higher than that of said first semiconductor layer, said drain electrode is formed on the backside of said conductive substrate.

3. The field effect transistor having a vertical structure of GaN-type semiconductors according to claim 1, wherein
   if a conductive substrate on which said first semiconductor layer is formed has a thermal conductivity lower than that of said first semiconductor, said drain electrode is formed on the backside of said first semiconductor layer being rid of said conductive substrate.

4. The field effect transistor having a vertical structure of GaN-type semiconductors according to claim 1, wherein
   said first through fifth semiconductor layers are formed by gas source MBE (Molecular Beam Epitaxy) or MOCVD (Metal Organic Chemical Vapor Deposition).

5. The field effect transistor having a vertical structure of GaN-type semiconductors according to claim 1, wherein
   said first semiconductor layer is composed of a lightly-Si-doped n$^-$-GaN layer, said second semiconductor layer an undoped i-GaN layer, said third semiconductor layer a p$^+$-GaN layer, said fourth semiconductor layer an n$^+$-GaN layer, and said fifth semiconductor layer an n$^+$-GaN layer.

6. The field effect transistor having a vertical structure of GaN-type semiconductors according to claim 1, having a device structure in which
   said third semiconductor layer is omitted, and said fourth semiconductor layer is buried directly into said second semiconductor layer.

7. The field effect transistor having a vertical structure of GaN-type semiconductors according to claim 1, having a device structure in which
   said second semiconductor layer is omitted, and said third semiconductor layer is arranged directly in said groove portion provided in said first semiconductor layer.

* * * * *